(12) United States Patent
Mason et al.

(10) Patent No.: US 6,272,451 B1
(45) Date of Patent: Aug. 7, 2001

(54) SOFTWARE TOOL TO ALLOW FIELD PROGRAMMABLE SYSTEM LEVEL DEVICES

(75) Inventors: Martin Thomas Mason, San Jose; David Andrew McConnell, Alameda; Ajithkumar Venkata Dasari, Santa Clara, all of CA (US)

(73) Assignee: Atmel Corporation, San Jose, CA (US)

(*) Notice: Subject to any disclaimer, the term of this patent is extended or adjusted under 35 U.S.C. 154(b) by 0 days.

(21) Appl. No.: 09/354,955

(22) Filed: Jul. 16, 1999

(51) Int. Cl.[7] ............... G06F 9/455; G06F 17/50
(52) U.S. Cl. ............... 703/13; 703/14; 703/15; 703/21; 703/22
(58) Field of Search .................. 703/13, 23, 14, 703/15, 20, 21, 22

(56) References Cited

U.S. PATENT DOCUMENTS

| | | | |
|---|---|---|---|
| 5,771,370 | * 6/1998 | Klein ................ | 395/500 |
| 5,841,967 | * 11/1998 | Sample et al. ........ | 714/33 |
| 5,946,472 | 8/1999 | Graves et al. ........ | 395/500 |
| 5,960,182 | * 9/1999 | Matsuoka et al. ..... | 395/500 |
| 5,987,243 | 11/1999 | Aihara .............. | 395/500 |

OTHER PUBLICATIONS

J.M. Saul, 'Hardware/Software Codesign for Fpga–Based Systems', 3/99, IEEE 0–7695–0001–3/99, pp. 1–10.*

* cited by examiner

Primary Examiner—Kevin J. Teska
Assistant Examiner—Lonnie A. Knox
(74) Attorney, Agent, or Firm—David Newman Chartered (57) ABSTRACT

A method and system for co-verifying a hardware simulation of a field-programmable-system-level integrated circuit (FPSLIC) and a software simulation of the field-programmable-system-level integrated circuit. A FPSLIC device is simulated in hardware, and a simulator-port layout of the FPSLIC device is generated. In software, the method separately simulates, with an instruction-set simulator, the FPSLIC device, and outputs register contents from the instruction-set software. The contents from the simulator-port layout are verified with the register contents. Additionally, the method may further include outputting peripheral contents from the instruction-set simulator, and verifying contents from the simulator-port layout with the peripheral contents. UART contents also may be outputted from the instruction-set simulator, and verified with contents from the simulator-port layout with the UART contents.

18 Claims, 3 Drawing Sheets

SOFTWARE TOOL TO ALLOW FIELD PROGRAMMABLE SYSTEM LEVEL DEVICES

BACKGROUND OF THE INVENTION

This invention relates filed programmable system level integrated circuits (FPSLIC), and more particularly to a method and system for co-verifying a hardware simulation and a software simulation of a FPSLIC device.

DESCRIPTION OF THE RELEVANT ART

System level integration (SLI) is rapidly becoming the preferred way to implement electronic designs. Integrating all the system functionality in a system-level integrated circuit (IC) increases performance, reduces power consumption, cuts unit production costs and allows smaller products. These are particularly important benefits in telecommunications, multimedia and networking applications.

A "system" consists of three main building blocks: a processor, memory and logic. Usually, the processor is used for control flow logic, the memory is used for program and data storage and the logic is used for datapath logic. A true system-level solution must contain all three elements.

The ASIC Solution

Until now, system level integration has been implemented in cell-based or masked application specific integrated circuits (ASICs), because these were the only solution available with Unfortunately, ASICs have high non-recurring engineering (NRE) costs, long lead times and significant minimum order quantities. As a result, system level ASIC implementations have been accessible only to the highest volume designs with relatively long product life cycles. Minimum volume requirements for system-level ASIC devices currently are often more than $500K per design per year. Designs with short product life cycles, low to medium volumes, time to market pressures or rapidly evolving standards can not afford the lengthy development cycle, risk and high NRE charges associated with an ASIC solution.

Even when the volume/dollar criteria are met for an ASIC solution, any change in the design to correct an error or improve it leaves the developer with a large inventory of possibly useless parts and another lengthy ASIC design cycle. This is particularly problematic for rapidly evolving designs such as those in telecommunications, networking and multimedia. For these and other designs a programmable solution is preferable because the design can be changed at will both during development and in the field. ASIC solutions are not an option for these designs.

A substantial number of these rapidly evolving designs are implemented in a combination of programmable logic, discrete standard products (microcontrollers, memories) and Application LAW OFFICES Specific Standard Products (ASSPs), such as T1 Interface, ATM, 10/100 PHY, and Video/Audio Codecs. Although this approach offers the flexibility to evolve designs rapidly it does not offer the performance, power, space and reliability advantages of a monolithic system level integrated circuit. A single-chip, programmable solution is clearly the preferable alternative. Multiple Approaches to Programmable System Level Integration Field programmable gate array (FPGA) and other IC vendors have developed a variety of approaches to providing programmable system level integration. These include "pure play" high-density FPGAs and hybrid devices that combine both FPGA and fixed logic functionality.

The most widely promoted means of achieving programmable SLI today are Xilinx's Virtex® and Altera's APEX® FPGA families that boast as many as a million gates. Although industry analysts believe these gate counts may be substantially overstated, these devices are still large enough to support system level integration of designs that might otherwise go into a masked- or cell-based ASIC. FPGAs now compete with masked-ASICs in terms of both density, and in the case of low density FPGAs, price. High density FPGAs are being proposed as a programmable, single-chip solution for system level integration. Although the programmability of the large FPGAs is very attractive, they have some significant drawbacks:

Although deep sub-micron process technologies have reduced the prices of low and medium density FPGA so that in many cases FPGA prices are on a par with those of ASICs, high gate count devices are extremely expensive. For example, Xilinx's million gate Vertex XCV1000 device currently sells for $4,298.00 each. The extremely high prices of these devices limits their use to ASIC prototyping and production runs of a handful of very high priced products. When one considers that a masked-ASIC of comparable density cost about $50, these large FPGAs are out of reach for most volume designs/applications.

Although FPGA devices can cut the ASIC development cycle in half, the complexity of large FPGAs mandates a significant design and development process for system level designs. Today 'time-to-market' is the difference between success and failure of a product. Designing a million gates of FPGA logic takes a great deal of time. Frequently intellectual property (IP) cores are used to reduce the design cycle. However, integrating vendor supplied soft IP into a design is in itself often a cumbersome and time-consuming process.

Simulation is another problem with large FPGAs. HDL simulations are notoriously slow for simulating large designs, especially ones using complex soft IP cores. Simulating a one million gate FPGA design can take so long that many designers simulate less thoroughly than is desirable or not at all. The result is that these designs are more likely to have undiscovered bugs that extend the debug cycle, further delaying product introductions.

This problem is further amplified if a microcontroller soft IP core is being used in a large FPGA design. Conventional MCU design methodologies are not available to the designer in the large FPGA based design flow. Typically, microcontroller designers have code development and debugging tools that are used to debug the microcode. These tools are often not available for soft IP cores used on a large FPGA, so code development and debugging are problematic if not impossible.

Furthermore, because of the lack of code development and debugging tools available for processor cores, the integration and debug of the microcontroller portion of a these designs is extremely difficult. Similar arguments can easily be made for timing analysis on system-level FPGA designs.

One solution to the complexity of designing system-level FPGAs is to use "drop-in" soft intellectual property cores. Memory, logic and a limited number of processor IP cores can be purchased from third party vendors and dropped into large FPGAs. However, soft IP cores are expensive, difficult to integrate in the design, and tend to be silicon inefficient. The difficulty of integrating IP cores from different third-party vendors can significantly extend the product development cycle. For example, an 8051 core for the Xilinx Virtex, supplied by Dolphin in France, costs over $10,000 to license and uses 1010 CLBs or 16.4% of a XCV1000. At a list price of $4,298 for each XCV1000, the silicon cost of the 8051 core is $704, excluding the cost of the core itself.

"The Flip-8051 core forms the heart of a family of processors that include lower performance options as well as microcontroller configurations that include peripherals such as timers and serial interfaces. Pricing starts as low as $10,000 for an EDIF format for Virtex FPGAs. Other design file formats are available. A VHDL source-code version is available with a test bench at extra cost.

There are additional design problems associated with building the interfaces between the various cores and correcting timing problems. Studies have shown that up to one half of the typical design project is spent in the integration and test phase, which in reality becomes an exercise in correcting the accumulation of errors from the front end of the design cycle. These problems are magnified when multi-site, multi-engineer development teams work on large FPGA-based systems. The errors often reach all the way back to the specification and partitioning phase, where ambiguities in the hardware/software interface were introduced and then amplified during the hardware/software implementation phase. Often, the remedy of these errors is forced into software due to the long lead times and high cost of ASIC or large FPGA turns—even though a software fix may result in compromised performance or functionality in the final product.

Although FPGAs represent an efficient means of implementing data-path functions, control logic is better suited to a CPLD or microcontroller architecture. FPGA implementations of control logic are not silicon efficient. This is demonstrated by the architectural changes that Altera has implemented in their next generation large FPGAs. The inclusion of CPLD blocks of logic in these large devices clearly shows a weakness in implementing control flow logic in current homogeneous large FPGA solutions. The inclusion of CPLD structures helps control flow in the Altera APEX architecture, however, the CPLD solution is still less efficient than a microcontroller at implementing control flow and decision making.

For example, a mail sorting system must acquire the visual data on each piece of mail using a high speed camera, convert the data from analog to digital, pre-process it to identify the location and orientation of the address, process the address pixels to decode the address and then generate machine readable code that can be read by the sorting machine. Just identifying the address in the image requires an enormous amount of data processing because each pixel has to be compared to all the pixels surrounding it. Since so much of the image is likely to be irrelevant, it would be inefficient and slow to process the entire image with a processor. FPGA based DSP algorithms can be used to filter out those portions of the image that are not likely to be part of the street address. This process eliminates most of the image, thereby cutting the processing problem to a manageable size. FPGAs are ideal for these types of operations and can perform them significantly faster than a DSP processor.

A processor, on the other hand, performs the algorithms for image extraction, de-skewing, rotation and data interpretation much more efficiently than an FPGA. FPGAs are inadequate to these tasks because the amount of complex 'decision' making involved (control flow). They are simply too slow at performing control flow tasks. Implementing a processor that is capable of the tasks outlined above using FPGA core cells (LABs/CLBs) is difficult and very silicon inefficient and therefore very expensive. Since all systems contain both datapath and control flow logic, system level integration in a general purpose FPGA cannot ever be terribly efficient. In short, on its own, a general purpose FPGA is not a solution.

Power consumption has three components: static power consumption, dynamic power consumption, and input/output (I/O) or system power consumption. Static power consumption is a function of the number of transistors in the device and increases with the size of the FPGA. However, with careful design even large FPGAs can have very low static power consumption. The second source of power consumption, dynamic power consumption, is consumed in the I/O structure. Significant power is dissipated each time an output switches from one logic state to another. Capacitive loading on the printed circuit board (PCB) is the reason for this power consumption. Reducing the number of parts in a system through integration significantly reduces this aspect of system power consumption. Since most large FPGAs still have to connect to the high-bandwidth microcontroller bus, significant power is consumed through this interface.

The third component of power consumption is dynamic. The combination of a large numbers of core cells for design implementation and the internal clock distribution tree significantly contribute to power consumption. Thus the larger FPGAs that must be used for SLI designs draw proportionately more power. Programmable SLI in a large FPGA is likely to consume a great deal of power.

Because of the above issues, just increasing the density of FPGAs is probably not the most practical solution to achieving programmability with system level integration.

Recently, a handful of fabless IC start-ups have developed hybrid devices that integrate blocks of programmable logic with a hard-wired microprocessor cores. The introduction of these devices indicates the need for products that address the SLI needs of the systems architect.

These devices are too specialized to fall into the general purpose SLI category. For example, Triscend's configurable 8052 EV5 microcontroller is positioned as a replacement for a single-chip MCU with peripherals that are programmed into an on-chip FPGA with 5,000 to 30,000 gates. These devices provide embedded systems designers custom MCU derivatives without having to order the 100,000 units conventional MCU vendor require to consider creating a derivative.

Another silicon valley start-up is Chameleon Systems which has announced a yet to be introduced "reconfigurable network processor". Although product details have not yet been disclosed, all indications point to a specialized product that addresses specific telecom/networking applications.

Chameleon will focus on the complex communication processing requirements between the physical interface (PHY) and the switch fabric prevalent in the convergence of the data networking and telecom markets.

Specialized FPGA Based Devices: Both Lucent Technologies and Quicklogic have announced FPGAs that include specialized functions, such as PCI. However neither company has introduced a true system-level product, with a processor, memory and datapath logic.

None of these solutions provides truly programmable system level integration, namely programmable logic, microcontroller and memory, with design tools that support system-level design methodology.

SUMMARY OF THE INVENTION

A general object of the invention is to allow programmable logic users to design, with ease, FPSLIC devices that contain complex blocks, such as, but not limited to, microprocessors such as AVR, ARM and 8051, embedded memory blocks such as RAMs, ROMs and EEPROMs, interface circuitry such as SPI, USB, PCI and I²C, and FPSLIC devices such as AT40K.

Another object of the invention is a software tool which acts as a design and methodology flow manager.

An additional object of the invention is a software tool which has design flow through the various CAE development tools changes based on the device selected in the design manager.

According to the present invention, as embodied and broadly described herein, a method for co-verifying a hardware simulation, programmed logic of a field-programmable-gate array (FPGA) and a software simulation, program code, of the tield-programmable-gate array, is provided.

A FPSLIC device includes field programmable gate array (FPGA) core, a microcontroller, and memory. The FPGA core includes a plurality of gates, which may be, for example, an SRAM-based FGPA eight-sided logic cell architecture. The logic cell architecture performs complex functions without impacting bus resources.

The plurality of gates are programmable by an external NVM, configuration memory, or the microcontroller. For example, a specific application requires a program in the microcontroller to set the FPSLIC device FPGA programmable logic for the application. In many applications, the logic in the FPGA is loaded at power-up.

Software for the application may be stored in the FPSLIC memory.

The memory includes dynamic-allocation-program memory, fixed-data memory, and a memory controller. The dynamic-allocation-program memory might be, by way of example, a 32 kilobyte (32K×8) block of 20 nanoseconds SRAM for program instruction storage. If not all 32 kilobytes were required for instruction storage, then the memory may be partitioned during design development into blocks to provide additional data memory storage. Additionally, fixed-data memory may be increased by adding partitions from dynamically-allocation-program memory.

A hardware-multiplication accelerator enables the microcontroller to perform complex digital signal processor (DSP) operations quickly and efficiently.

Additional objects and advantages of the invention are set forth in part in the description which follows, and in part are obvious from the description, or may be learned by practice of the invention. The objects and advantages of the invention also may be realized and attained by means of the instrumentalities and combinations particularly pointed out in the appended claims.

BRIEF DESCRIPTION OF THE DRAWINGS

The accompanying drawings, which are incorporated in and constitute a part of the specification, illustrate preferred embodiments of the invention, and together with the description serve to explain the principles of the invention.

DETAILED DESCRIPTION OF THE PREFERRED EMBODIMENTS

Reference now is made in detail to the present preferred embodiments of the invention, examples of which are illustrated in the accompanying drawings, wherein like reference numerals indicate like elements throughout the several views.

The ever-increasing time to market requirements of field programmable gate arrays makes necessary a software tool which manages and tightly integrates various discrete 'point' computer aided engineering (CAE) tools. The CAE tools can be used extensively by designers to develop code for FPSLIC devices.

The present invention combines programmability with system level integration, to develop a family of system level integrated circuits (ICs) with specific dedicated functionality that provides a silicon efficient means of creating a system on a chip. The Field-Programmable System Level ICs (FPSLIC), by way of example, include an ATMEL AT40K FPGA for datapath logic, the RISC-based AVR microcontroller for control logic, a hardware multiplier, MCU peripherals and 36 Kbytes of SRAM: all the building blocks of a system. The FPSLIC architecture is ideal for the implementation of networking, telecommunications, multimedia, audio, handheld, portable and industrial control applications.

Figure 1A:
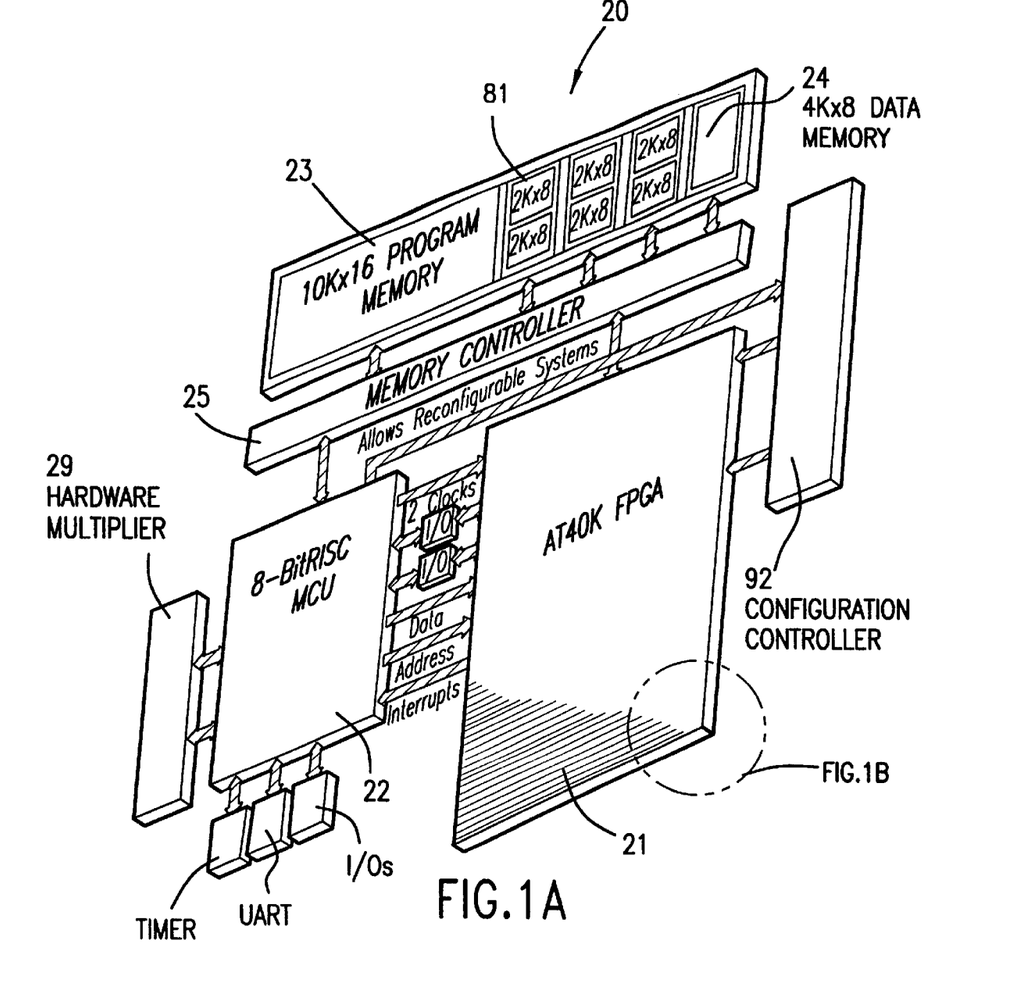
FIG. 1 is a block diagram of an FPSLIC device.
Figure 1B:
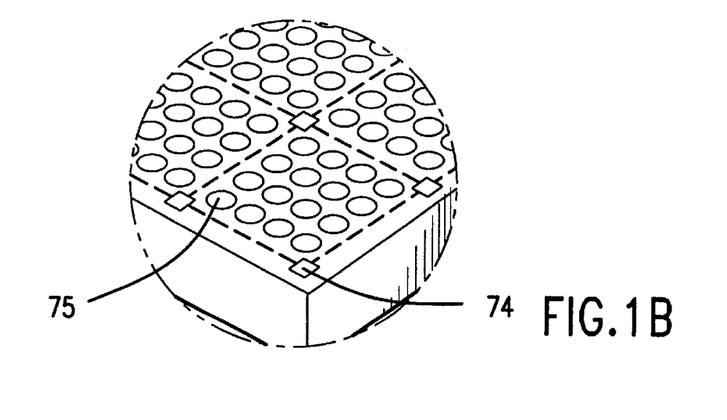

As illustratively shown in FIG. 1, a field programmable system level integrated circuit (FPSLIC device) 20 includes field programmable gate array (FPGA) core 21, a microcontroller 22, and memory. The FPGA core includes a plurality of gates, shown as SRAM-based AT40K FGPA eight-sided logic cell architecture 75. The logic cell architecture 75 performs complex functions without impacting bus resources. Discrete free-RAM ten nanoseconds dual port SRAM blocks 74 are located at the corners of each 4×4 cell sector. Locating these SRAM blocks throughout the array puts memory where it is needed, and supports high-performance first-in-first-out (FIFO) designs.

The plurality of gates are programmable by an external NVM, configuration memory, or the microcontroller 22. For example, a specific application requires a program in the microcontroller 22 to set the FPSLIC device FPGA programmable logic 21 for the application. In many applications, the logic in the FPGA is loaded at power-up. Software for the application may be stored in the memory of the microcontroller 22. In operation, the microcontroller 22 sets to gates of the FPSLIC programmable logic 21 for the application.

The memory includes dynamic-allocation-program memory 23, fixed-data memory 24, and a memory controller 25. The dynamic-allocation-program memory 23 might be, by way of example, a 32 kilobyte (or 32K×8) block of 20 nanoseconds SRAM for program instruction storage. If not all 32 kilobytes is required, then the program memory may be partitioned during design development into eight 4 kilobyte blocks, by way of example to provide additional data memory storage. Additionally, fixed-data memory 24 may be increased by adding partitions 81 from dynamically-allocation-program memory 23.

A hardware-multiplication accelerator 29 enables the microcontroller 22 to perform complex digital signal processor (DSP) operations quickly and efficiently.

The FPSLIC solution stems from a unique high performance FPGA architecture, and several microcontroller core technologies. The FPSLIC employs cell-based and masked ASIC and Application Specific Standard Product (ASSP) development, the technology and expertise to combine these functions into silicon efficient, cost effective system level devices.

The AVR based FPSLIC product incorporates Atmel's AT40K embedded FPGA technology. The AT40K FPGA core is programmable logic which is a fully PCI-compliant, SRAM-based FPGA with distributed ten nanoseconds programmable synchronous/asynchronous, dual port/single port SRAM, 68 external global clocks and 2 AVR global clocks, Cache Logic ability (partially or fully reconfigurable without loss of data) and 10,000 to 40,000 usable gates.

The microcontroller executes instructions in a single clock cycle, achieving throughput that approaches one MIPS per MHz. The substantial throughput allows system architects to optimize power consumption versus processing speed. A AUR MIPS microcontroller core is based on an enhanced RISC architecture that combines a rich instruction set with 32 general-purpose working registers. All the 32 registers are directly connected to the arithmetic logic unit (ALU), allowing two independent registers to be accessed in one single instruction executed in one clock cycle. The resulting architecture is more code efficient while achieving throughout up to ten times faster than conventional CISC microcontrollers.

The memory executes out of SRAM. Both the FPGA configuration memory and microcontroller 22 instruction code SRAM can be automatically loaded at system power-up using Atmel's in system programmable AT17 series EEPROM configuration memories. By combining the three main system building blocks on a single programmable device, an high performance system level product is created which is flexible enough and cost effective enough to be used as a general purpose SLI device.

FPSLIC EDA tool suite, System Designer, provides a truly integrated system design methodology and suite of design tools.

FPSLIC is the only programmable solution to include co-verification tools as standard. Co-verification facilitates the creation of virtual prototypes, which allows the problems typically encountered during system integration to be resolved much earlier in the design cycle, resulting in a shorter design cycle. Co-verification also allows rapid 'what if' trade-offs to be performed, fostering better system efficiencies.

Both the FPSLIC silicon and the System Designer software have been engineered as a complete SLI solution to accelerate time to market.

Designing with FPSLIC

By integrating all the functionality required to create a system level product in one programmable solution, FPSLIC devices present the user with a comprehensive and integrated solution. The FPSLIC device closely mimics a typical system level architecture. It has the common interfaces between microcontroller memory and logic already implemented allowing the designer to focus on the value added parts of the system design without compromising flexibility or performance.

Use of existing standard design tools with the addition of hardware (logic)/software (program code) co-verification means that reliable bug free microcontroller and FPGA development software is combined with software based system level simulation. The result is an easy to use productivity enhancing development tool (System Designer) that allow concurrent software and hardware design and dramatically accelerates design development and reduces a products time to market.

This combination of memory (SRAM), logic (FPGA) and a microcontroller 22 on a single SLI device provide for efficient implementation of the data-path (logic) and control flow (AVR microcontroller) aspects of SLI design. Instead of 'shoe-horning' a design into a homogeneous FPGA solution the FPSLIC devices provide efficient implementation of all aspects of the system. Silicon efficiency results in smaller die size, fast development times, high performance designs and lower power consumption. So dramatic is the effect with FPSLIC devices that device costs are two orders of magnitude less than competing large FPGA solutions. The usual trade-off associated with silicon efficiency is a lack of flexibility—however the use of a high performance RISC microcontroller with FPGA and a dynamically allocated SRAM memory provides both efficiency and flexibility.

In FPSLIC devices the intellectual property (IP) required for system level integration is an inherent part of the device. Additional IP blocks can be added to FPGA (logic) part of the design, e.g. from the library of parameterizable macro generators. Unlike large FPGAs the simulation, placement and timing challenges of integrating soft IP processors have mostly been removed from the FPSLIC parts. This accelerates time to market and allows the designer to focus on the value added aspects of the SLI design. Logic based soft IP cores can be used on the FPSLIC device if required in the logic part of the design.

Multiple features in FPSLIC devices cut power consumption dramatically, compared to the FPGA or discrete solution, including more efficient use of logic resources. By including a "hard" microcontroller core for the implementation of control logic, FPSLIC save power draining logic resources. A "soft" microcontroller core in a large FPGA requires substantially more logic gates than that consume substantially more power.

Since FPSLIC devices integrate all the required system blocks FPSLIC eliminates the I/O ports and capacitive loading associated with inter-device PCB connections significantly saving system power.

FPSLIC devices include the FPGA clocking tree structure, which is partitioned into small segments so the FPSLIC device only drives clocks lines to registers, as required. The clock partitioning can save 50%+ of the dynamic power consumption in the FPGA part of the FPSLIC device on a typical design.

The microcomputer 22 in the FPSLIC can be used in 'burst-mode' processing.

Burst mode processing allows the AVR to perform the processing in very short periods of time and then be put into power-down mode for the majority of the time, saving substantial power.

The combination of FPGA and microcontroller in FPSLIC devices allows partial reconfiguration of the FPGA core. Thus, a single design to be reconfigured to serve several purposes, saving both silicon and power.

This in-system reconfigurability is particularly useful for designs which must be able to implement multiple standards, such as "soft radios" being developed for third generation mobile communications. A single FPSLIC could contain multiple mobile phone (base-band) standards that allow it to operate in any location or environment. In a location where wide-band code division multiple access(W-CDMA) is the standard, the W-CDMA design would be loaded into the FPSLIC device. When the phone user traveled to a location where GSM was the standard, Europe for example, the FPSLIC device could be reconfigured on the fly with the GSM design. This would be entirely transparent to the user, but it would allow a single FPSLIC device to be used for many different system level mobile phone standards.

Atmel's System Designer EDA tool suite supports reconfigurable computing by supporting incremental design changes, extensive library controls and bitstream utilities.

Design Tools

Designing, simulating and debugging an ASIC or ASSP design is a daunting task, at best. Designing a very large FPGA is equally as cumbersome. Even when the designer can, with confidence, drop in a soft-IP core of a microcontroller, he/she is faced with some serious design tool challenges. Issues of place and route times, design complexity, interactions between IP from different IP vendors and design performance are just some of the immense challenges facing designers of large FPGAS.

Unlike large FPGA design tool suites which have not changed to accommodate the additional challenges associated with implementing SLI, the FPSLIC design tools concurrently are developed with the FPSLIC architecture to ensure a seamless development environment between the programmable logic and microcontroller areas of the tool.

System Designer Co-Verification EDA Tool Suite

FPGAs are usually designed using hardware description languages (HDLs), such as Verilog or VHDL and then simulated using an HDL simulator. Microcontroller designs are usually done in the C-language or assembly and debugged using a software debugger or ICE (In-circuit emulator). The challenge Atmel faced was integrating these two solutions into an environment that not only allowed for easy product development and accelerated the designers time to market, but also allow the designer to do extensive 'what if' analysis between the hardware and software aspects of the design very early in the design process.

Atmel has solved the problem of software/hardware co-design by developing the System Designer Co-verification EDA tool suite. The need for hardware/software co-verification has grown out of the productivity and time-to-profit obstacles inherent in the conventional design cycle. Up to half of the typical design project is spent in the integration and test phase. In reality this is an exercise in correcting the accumulation of errors from the front end of the design cycle. These errors often reach all the way back to the specification and partitioning phase, where ambiguities in the hardware/software interface were introduced and then amplified during the hardware/software implementation phase. Often, the remedy of these errors is forced into software due to the long lead times and high cots of ASIC turns—even though a software fix may mean compromised performance or functionality in the final product.

System Designer seamlessly integrates Atmel's FPGA design tools and a third party hardware (verilog/VHDL) simulator with its AVR microcontroller instruction simulator and debugging tools. In addition, a co-verification framework fully synchronizes hardware and software execution, and source-and assembly-level software debugging. The tool suite provides full visibility of the AVR memory and registers, and full hardware design visibility. System Designer allows designers to do the complete hardware and software design with complete confidence. Software/hardware trade-offs can be made and tested until an optimized implementation is arrived at. Design cycles can be cut by as much a 90%. In addition combining the software development tools with logic simulation, the co-verification environment delivers high performance co-verification months ahead of a discrete solution. The co-verification environment enables software and hardware development to be parallel activities, removing the software from the critical path, and reducing the risk of hardware prototype iterations resulting from integration errors.

The FPGA design software in System Designer is based on Atmel's IDS tools. It includes Macro Generators, HDL-Plannertm push button automatic place and route, floor planning, timing driven design, both static and interactive timing analysis, bitstream utilities, incremental design change capability, architecture mapping, back annotation, an interactive layout editor and a library manager.

System Designer comes with push button macro generators that facilitate the design of fully parameterizable hard or soft intellectual property (IP) cores for the FPSLIC FPGA array. The macro generator calculates power consumption, area and pitch of the macros. All Atmel macros are optimized for the AT40K architecture. More than fifty macro generators are available in System Designer that can be used to create fully parameterized IP cores of virtually any complexity. The macro generators include: adders, FIFOs, counters, comparators, decoders, flip flops, latches, RAMs, CRC, integer dividers, linear feedback shift registers, (LSRs), fast pre-scale counters, accumulators, deductors, multipliers, muxes, negation, shifters, ROMs, subtractors and tri-state bus control. These functions can be parameterized for word-width, power or area and trade-offs can be made easily.

System Designer's macro generators are invoked from pull-down menus so the designer need only point and click to create the desired functionality. Once the macro generator is invoked, a dialog box lets the designer specify any parameters that are appropriate to the macro.

Designers can also download from Atmel's WWW site details of complex IP cores, such as FIR filters, IIR filters, convolvers and other functions that are available for free from Atmel's growing library of FPGA intellectual property.

Atmel's HDLPlanner tool automates the development of FPGA VHDL or Verilog descriptions by automatically generating syntactically correct Verilog or VHDL code. HDL-Planner can generate HDL descriptions from macros developed with System Designer's macro generator tools. Any design done using HDL Planner is completely device and technology independent and can be synthesized, using industry standard synthesis-tools, for implementation in any ASIC or FPGA. HDL-Planner automatically instantiates components that are optimized for Atmel FPGAs. The instantiated components are completely transparent to the user. Although they are architecturally optimized for the AT40K FPGA logic, instantiated components have no affect on the technology independence of the HDL designs.

FPSLIC Firmware Design and Debugging:

Atmel's AVR software design environment is an integral part of the System Designer EDA Tool Suite. It enables the development, execution and debugging of AVR programs using a built-in instruction set simulator.

AVR Studio provides a "Source" window with the program code and a pointer that marks the code currently being executed. It has a variety of views that assist in debugging the design. These include windows that: display the values of defined symbols, including instance variables in a C-program; display the contents of all 32 of the AVR's registers; report messages issued by AVR Studio; allow the user the to view and modify the contents of all AVR memory resources; show the address of the next instruction to be executed, the value of the stack;

pointer, and the number of clock cycles that have elapsed since the last reset; show the status of peripheral devices; display information about any AVR timer/counters; show the three I/O registers on each of the AVR ports; show the status of on-chip peripherals (UARTs, SPI).

FPSLIC Co-verification routines allow the HDL simulator and the AVR instruction set simulation to run simultaneously and interactively. Since the hardware and software are designed and debugged together, the likelihood of getting a design that works the first time is greatly increased. Total system development time can be cut by 10% to 90%. The FPSLIC System Designer software suite is unique in its completeness and ability to accelerate time to market.

The FPSLICs EDA environment is based on a systems approach to design methodology, including co-verification of the hardware and software.

Figure 2:
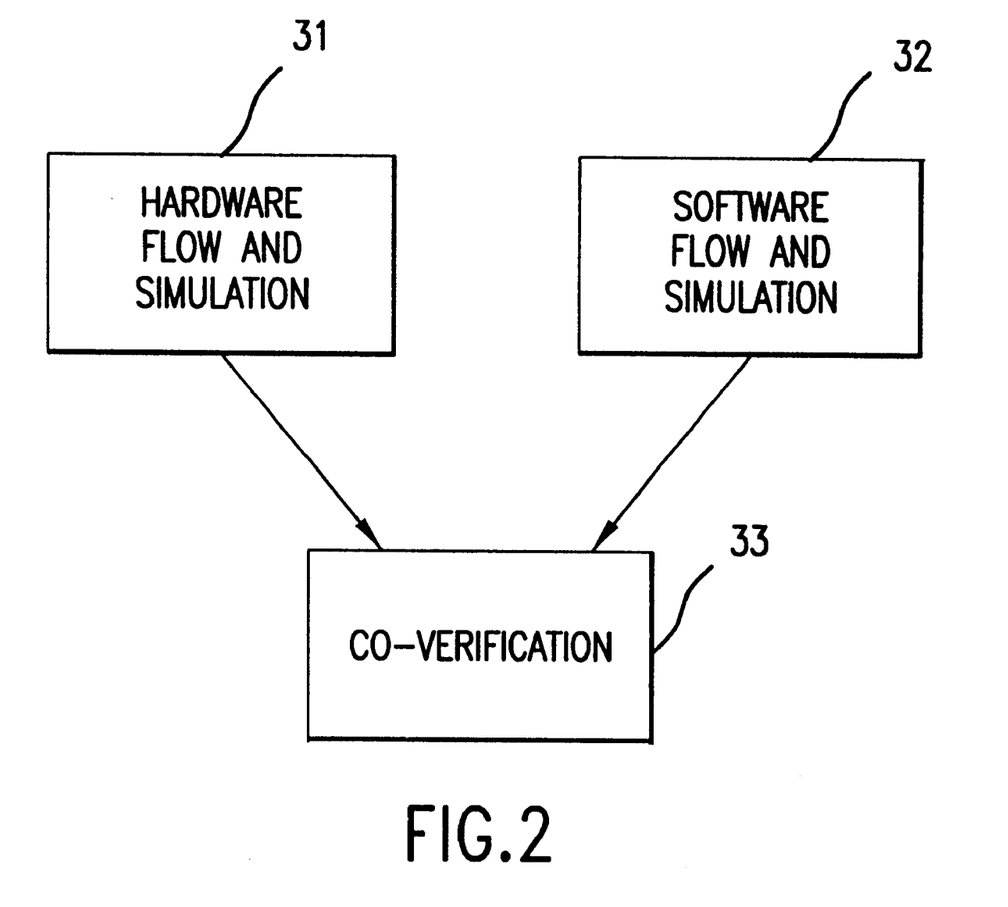
FIG. 2 illustrates co-verification of hardware and software, flow and simulation.

FIG. 2 broadly shows co-verification 30 of a hardware flow and simulation 31 and software flow and simulation 32. The hardware flow and simulation executes a hardware implementation of the FPSLIC device 20. The software flow and simulation is a software implementation on the FPSLIC device 20 or a processor or computer. The software implementation 32, however, typically is a pure software implementation of the FPSLIC device 20 on the FPSLIC device.

The co-verification 30, the software flow and simulation 32 with the hardware flow and simulation 31 is the heart of the present invention. Software flow and simulation 32 is readily available software. The co-verification 30 supports the ability to simulate the hardware part of the FPSLIC design and the software side of the FPSLIC design in one unified environment. If something in the FPSLIC device 20 changes during a design, a modification can be made in the software flow and simulation 32.

Figure 3:
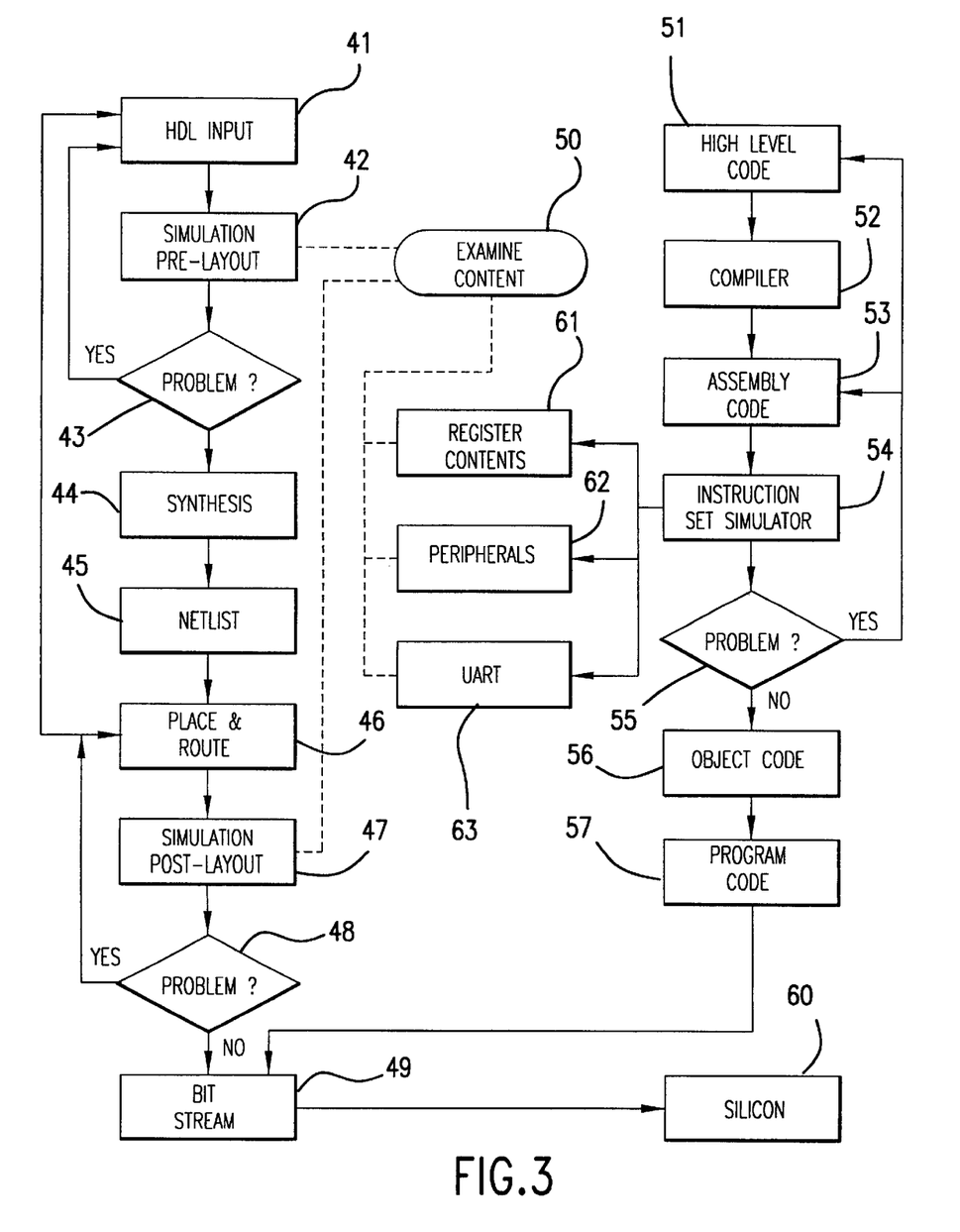
FIG. 3 is a flowchart of a hardware (FPSA) flow and simulation and a software (microcontroller) flow and simulation, with co-verification.

In the exemplary arrangement shown in FIG. 3, a method for co-verifying a hardware simulation of a field-programmable-gate array and a software simulation of the field-programmable-gate array, is provided. The method comprises the steps of simulating, in hardware, a FPSLIC device.

More particularly, FPSLIC software for running the FPSLIC device is inputted 41 to the FPSLIC device. The FPSLIC software is a simulation of the application for which the device will be used. The FPSLIC device software is run as a simulation 42. If there were a problem with the simulation 43, then the FPSLIC device software can be modified or altered, re-inputted 41 and the simulation 42 run again.

If there were no problem with the FPSLIC device software, then a synthesis 44, and from the synthesis, a netlist 45 is generated of the FPSLIC device software. From the netlist 45, place and route 46 are generated, and a resulting simulation post layout 47. On the FPSLIC device, the contents of the simulation post layout 47 are checked for a problem 48, and if there were a problem, then alterations can be made in the place and route 46 or to the FPSLIC device software at the input 41.

If there were no problems 48 with the simulation post layout 47, then a bit stream can be generated for implementing the FPSLIC device in silicon 60.

In software, the method separately includes the steps, using a processor or computer, of simulating, with an instruction-set simulator, the FPSLIC device, and outputting register contents from the instruction-set software. More particularly, a high-level code 51 is written for simulating the FPSLIC device. The high-level code may be, for example, C language. The high-level code 51 is compiled by a compiler 52 as assembly code. Alternatively, Assembly code may be written for the FPSLIC device, and the process starts with the assembly code 53.

The instruction set simulator 54 runs the assembly code as a simulation of the FPSLIC device. The instructions set simulator can output contents for registers 61, peripherals 62, UART ports 63, and other desired check points in the software. The outputs and instruction set simulator 54 are checked for problems 55. If there were a problem, the high-level code or assembly code can be modified, and the instruction-set simulator 54 run again.

If there were no problems 55, then the assembly code is outputted as object code 56, and then program code 57. The program code 57 is used to manufacture the FPSLIC device in silicon 60.

The method further includes verifying contents from the simulation post layout with the register contents. The verification is depicted as examine content 50 of the register contents 61, peripherals 62 and UART ports 63, as well as the simulator post layout 47. The co-verification speeds up the process to realizing the FPSLIC in silicon, since the software flow and simulation and the hardware flow and simulation are verified interactively.

It will be apparent to those skilled in the art that various modifications can be made to the software tool for allowing field programmable system level devices of the instant invention without departing from the scope or spirit of the invention, and it is intended that the present invention cover modifications and variations of the software tool for allowing field programmable system level devices provided they come within the scope of the appended claims and their equivalents.

We claim:

1. A method for designing a field programmable system level integrated circuit (FPSLIC), comprising the steps of:

simulating, pre-layout, the field programmable system level integrated circuit using co-verification software;

generating, from an implementation of logic for the field programmable system level integrated circuit with instruction-set software, a simulation post layout model of the implementation for co-verification of the field programmable system level integrated circuit;

simulating, with an instruction-set simulator, program code;

outputting register contents from the instruction-set software, for the co-verification of the field programmable system level integrated circuit;

creating a bit stream for a field programmable gate array (FPGA) device part of the field programmable system level integrated circuit;

creating a program code for a micro-controller part of the field programmable system level integrated circuit; and creating, from the bit stream and the program code, in a program file, a combined-bit stream that has data for both the FPGA device and instruction code for a RISC micro-controller.

2. The method as set forth in claim 1, further including the steps of:

outputting peripheral contents from instruction-set software; and verifying contents from the simulation post layout with the peripheral contents.

3. The method as set forth in claim 1, further including the steps of:

outputting UART contents from the instruction-set software; and verifying contents from the simulation post layout with the UART contents.

4. A system for designing a field programmable system level integrated circuit, comprising:

a software simulator for simulating, layout, a field programmable system level integrated circuit using co-verification software;

instruction set software for outputting register contents for the co-verification of the field programmable system level integrated circuit;

field programmable gate array (FPGA) software for creating a bit stream for an FPGA device part, and for creating a program code for the micro-controller Dart of the FPSLIC; and said FPGA software for creating, from the bit stream and the program code, in a program file, a combined-bit stream that has data for both the FPGA device and the instruction code for a RISC micro-controller.

5. The system as set forth in claim 4, with:

said instruction-set software for outputting peripheral contents; and said verification software for verifying contents from the simulation post layout with the peripheral contents.

6. The system as set forth in claim 4, with:

said instruction-set software for outputting UART contents; and said verification software for verifying contents from the simulation post layout with the UART contents.

7. A method for designing a field programmable system level integrated circuit (FPSLIC), comprising the steps of:

simulating, pre-layout, the field programmable system level integrated circuit using co-verification software;

generating, from an implementation of logic for the field programmable system level integrated circuit with instruction-set software, a post layout, simulation model of the implementation for co-verification of the field programmable system level integrated circuit;

simulating, with an instruction-set simulator, program code;

outputting register contents from the instruction-set software, for the co-verification of the field programmable system level integrated circuit;

creating a bit stream for a field programmable gate array (FPGA) device part of the field programmable system level integrated circuit; and creating a program code for a micro-controller part of the field programmable system level integrated circuit.

8. The method as set forth in claim 7, further including the steps of:

outputting peripheral contents from instruction-set software; and verifying contents from the simulation post layout with the peripheral contents.

9. The method as set forth in claim 7, further including the steps of:

outputting UART contents from the instruction-set software; and verifying contents from the simulation post layout with the UART contents.

10. A system for designing a field programmable system level integrated circuit, comprising:

a software simulator for simulating, pre-layout, a field programmable system level integrated circuit using co-verification software;

instruction set software for outputting register contents for the co-verification of the field programmable system level integrated circuit; and field programmable gate array (FPGA) software for creating a bit stream for an FPGA device part, and for creating a program code for the micro-controller part of the FPSLIC.

11. The system as set forth in claim 10, with:

said instruction-set software for outputting peripheral contents; and said verification software for verifying contents from the simulation post layout with the peripheral contents.

12. The system as set forth in claim 10, with:

said instruction-set software for outputting UART contents; and said verification software computer for verifying contents from the simulation post layout with the UART contents.

13. A system for designing a field programmable system level integrated circuit, comprising:

software means for simulating, pre-layout, a field programmable system level integrated circuit using co-verification software;

instruction means for outputting register contents for the co-verification of the field programmable system level integrated circuit; and field programmable gate array (FPGA) means for creating a bit stream for an FPGA device part, and for creating a program code for the micro-controller part of the FPSLIC.

14. The system as set forth in claim 13, with:

said instruction-set software for outputting peripheral contents; and said verification software for verifying contents from the simulation post layout with the peripheral contents.

15. The system as set forth in claim 13, with:

said instruction-set software for outputting UART contents; and said verification software for verifying contents from the simulation post layout with the UART contents.

16. A system for designing a field programmable system level integrated circuit (FPSLIC), comprising:

software means for simulating, pre-layout, a field programmable system level integrated circuit using co-verification software;

instruction set software for outputting register contents for the co-verification of the field programmable system level integrated circuit;

field programmable gate array (FPGA) means for creating a bit stream for an FPGA device part, and for creating a program code for the micro-controller part of the FPSLIC; and said FPGA means for creating, from the bit stream and the program code, in a program file, a combined-bit stream that has data for both the FPGA device and the instruction code for a RISC micro-controller.

17. The system as set forth in claim 16, with:

said instruction-set software for outputting peripheral contents; and software means for verifying contents from the simulation post layout with the peripheral contents.

18. The system as set forth in claim 16, with:

said instruction-set software for outputting UART contents; and said verification software for verifying contents from the simulation post layout with the UART contents.

* * * * *

UNITED STATES PATENT AND TRADEMARK OFFICE
CERTIFICATE OF CORRECTION

PATENT NO.   : 6,272,451 B1
DATED        : August 7, 2001
INVENTOR(S)  : Martin T. Mason, David A. McConnell and Ajithkumar V. Dasari It is certified that error appears in the above-identified patent and that said Letters Patent is hereby corrected as shown below:

Column 12,
Line 65, "layout" should read -- pre-layout --.

Signed and Sealed this

Fifteenth Day of March, 2005

JON W. DUDAS
*Director of the United States Patent and Trademark Office*